United States Patent [19]

Clark

[11] Patent Number: 4,861,272

[45] Date of Patent: Aug. 29, 1989

[54] IMPEDANCE CONTROLLED CONNECTOR INTERFACE

[75] Inventor: Stephen L. Clark, Dillsburg, Pa.

[73] Assignee: E. I. Du Pont de Nemours and Company, Wilmington, Del.

[21] Appl. No.: 175,785

[22] Filed: Mar. 31, 1988

[51] Int. Cl.$^4$ ............................................. H01R 9/09
[52] U.S. Cl. ...................................... 439/79; 439/67; 439/77; 439/493
[58] Field of Search .............................. 439/67, 79-83, 439/493, 77

[56] References Cited

U.S. PATENT DOCUMENTS

| | | | |
|---|---|---|---|
| 3,158,421 | 11/1964 | Hasenauer, Jr. ......................... | 439/67 |
| 3,401,369 | 9/1968 | Palmateer et al. ....................... | 339/17 |
| 3,573,704 | 4/1971 | Tarver .................................... | 339/14 |
| 4,227,767 | 10/1980 | Mouissie ................................ | 339/176 |
| 4,327,956 | 5/1982 | Sitzler ................................... | 339/107 |
| 4,552,420 | 10/1985 | Eigenbrode ........................... | 339/14 |
| 4,587,596 | 5/1986 | Bunnell .................................. | 439/67 |
| 4,636,019 | 1/1987 | Gillett et al. .......................... | 339/17 |
| 4,659,155 | 4/1987 | Walkup et al. ......................... | 339/14 |

Primary Examiner—P. Austin Bradley

[57] ABSTRACT

A connector interface for electrically mating a multi-row connector with a printed circuit board is defined by a flex circuit in the form of laminated polyimide layers having conductive traces for each interconnect pair with connection fields at the opposite ends of the traces for electrical connection to the terminal pins on the connector and the conductive pads or pins on the circuit board. The conductive traces are all of equal length to provide equal resistance and impedance paths for each of the circuit interconnects.

19 Claims, 5 Drawing Sheets

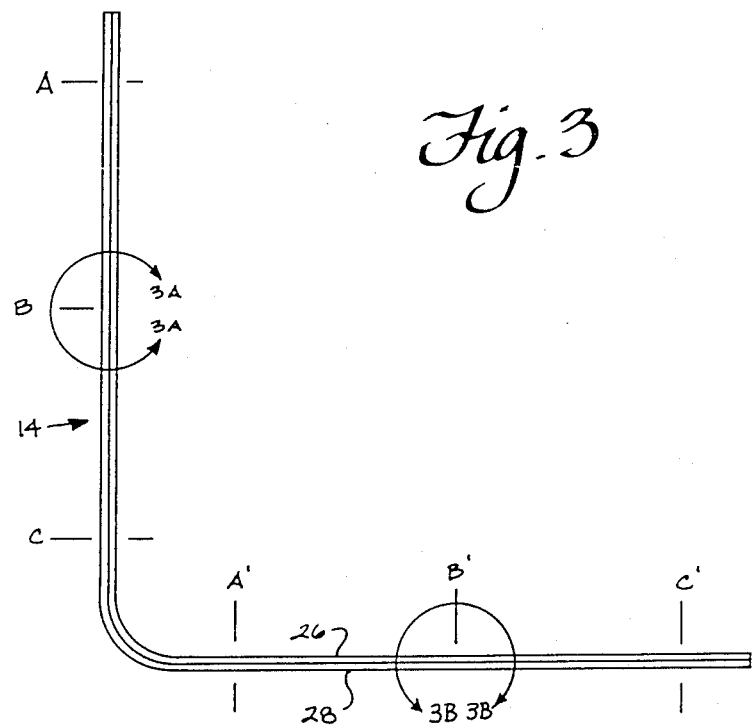
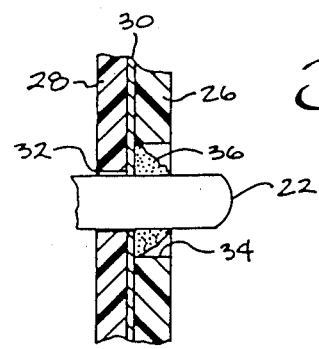
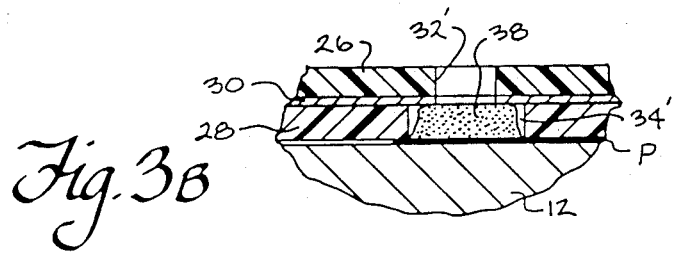
Fig. 3
Fig. 3A
Fig. 3B

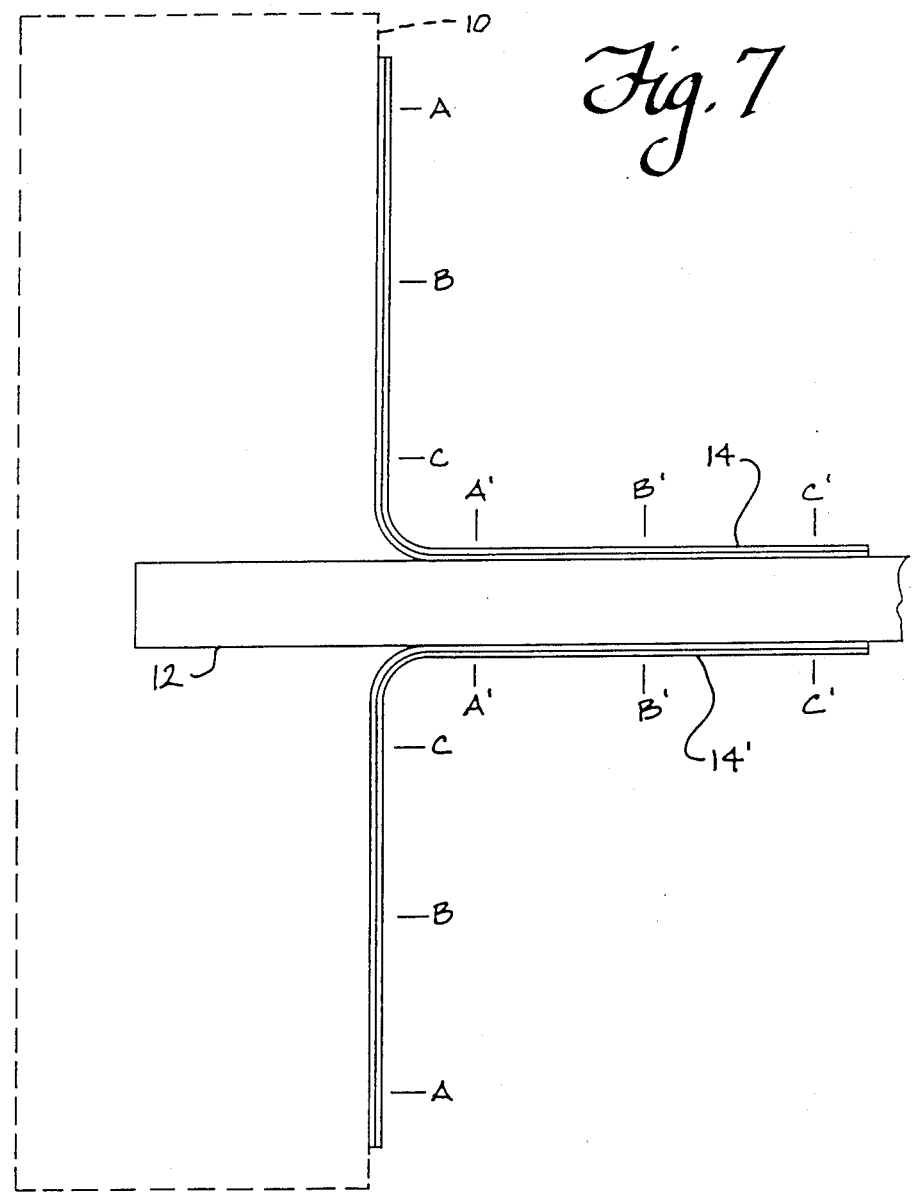

IMPEDANCE CONTROLLED CONNECTOR INTERFACE

BACKGROUND OF THE INVENTION

The present invention relates to electrical connectors and, more particularly, to the electrical interconnection of a multi-row connector to a printed circuit board to provide controlled impedance paths for each circuit interconnection.

Various systems have been used to mate electrical connectors to printed circuit boards or other circuit bearing substrates. In the general case, the connector includes receptacles having pin-like 'tail' portions of selected length that are designed to be electrically connected with conductive pads or traces on the printed circuit board. The tail portions can extend linearly from the connectors, that is, along a line co-incident with its receptacle or at an angle relative to its receptacle. Where the connector is mounted on one of the flat sides of the circuit board, the tail portions pass through respective holes in the circuit board and are soldered to conductive pads on the opposite side of the circuit board. Since the connector is mounted on the flat surface of the circuit board, the number of conductive pads on the circuit board can readily match the number of tail portions of the connector. The soldering of the tail portions effects electrical connection and, in many cases, provides an adequate mechanical connection to affix the connector to the circuit board. Where necessary, mechanical fasteners, including threaded fasteners, clamps, brackets, frames, and the like, can be used to assist in effecting the mechanical attachment. The requirements for an edge-mounted connector are somewhat different in that the surface area available at the edge of the circuit board represents a constraint on the total number of circuit board traces and pads that can be provided for interconnection with the connector. The surface-area limitation is exacerbated where the edge-mounted connector is of the multi-row type, that is, parallel rows of pins or receptacles that form a matrix of interconnects. For example, U.S. Pat. No. 4,659,155 to Walkup et al. discloses an edge connector for a circuit board having two rows of receptacles on each side of the circuit board in which equal length tail portions extend from the connector to respective contact pads aligned in a single row on the circuit board. While the Walkup et al. design represents a reasonable solution, this design is limited in the sense that a larger number of rows will increase the number of contact pads in the single row of contacts on the circuit board and increase the difficulty of assembly of the connector to the circuit board and make inspection of the various contacts more difficult.

One of the trends in electronic systems is the development of high speed digital circuits with a requirement for a relatively large number of circuit interconnects between circuit boards. In order to accommodate the requirement for a quantitatively large number of circuit interconnects, high pin count connector systems have been developed which locate the contact devices, either pins or receptacles, on relatively close centers, for example, 0.100 inches (2.54 mm.), in a multi-row matrix so that several hundred or more circuit connects are possible per connector. The tail portions of the connector can be connected to conductive traces on the printed circuit board by a flexible circuit fabricated from laminated Kapton layers with conductive traces extending between connection fields for the 'tail' portion of the receptacles of the connector and connection fields for the conductive pads or traces on the circuit board. While flexible circuit assemblies represent a reasonable design approach to the electrical interconnection of the connector and its circuit board, the closely adjacent conductive traces in high pin count applications provide different impedances, including resistive, capacitive, and inductive constituents, for the various circuits. While these impedance differences do not cause performance problems at low-frequencies, the relative impedance differences between circuits can cause problems at relatively high digital speeds, especially where the interconnects are part of a digital bus application in which all pulses must travel in a synchronous or quasi-synchronous manner with minimal relative degradation because of the impedance characteristics of the flexible circuit.

SUMMARY OF THE INVENTION

In view of the above, it is an object of the present invention, among others, to provide a connector interface for connecting an electrical connector to a circuit board.

It is another object of the present invention to provide a connector interface for electrically mating electrical connectors to a circuit board in which the impedance presented by each electrical interconnect is substantially the same for all of the interconnects.

It is still another object of the present invention to provide a connector interface for electrically mating electrical connectors to a circuit board in which the electrical resistance presented by each electrical interconnect is substantially the same for all of the interconnects.

It is a further object of the present invention to provide a connector interface for electrically mating high pin count multi-row electrical connectors to a circuit board in which the circuit path length for each electrical interconnect is substantially the same for all of the interconnects.

In view of these objects, and others, the present invention provides a connector interface for electrically mating a multi-row connector with a printed circuit board in such a way that the impedance of the interconnect circuitry, especially the resistance, is the same for each of the circuit paths. A flex circuit in the form of a flexible polyimide substrate and cover is provided with conductive traces for each interconnect pair with connection fields at the opposite ends of the traces for electrical connection to the tail portions on the connector and the conductive pads or pins on the circuit board. The conductive traces are all of equal length to provide equal resistance paths for each of the circuit interconnects. For a multi-row connector having N rows of interconnects, i.e., either receptacles or pins, the flexible circuit is provided with N sets of conductive traces with each of the N sets having trace lengths that are equal to one another within the set and to the trace lengths of the other of the N sets of conductive traces.

The present invention advantageously provides an impedance controlled interface for effecting an electrical connection between a connector and its circuit board in such a way that the resistance and related impedance characteristics are substantially the same for each circuit interconnect.

Other objects and further scope of applicability of the present invention will become apparent from the detailed description to follow, taken in conjunction with the accompanying drawings, in which like parts are designated by like reference characters.

BRIEF DESCRIPTION OF THE DRAWING

FIG. 3 is a side view of an exemplary flex circuit for interconnecting the terminal pins of the connector and the connection pads of the circuit board of FIGS. 1 and 2;

FIG. 3A is a detailed side view of a tail portion of a terminal pin extending through the flex circuit of FIG. 3 taken along line 3A—3A of FIG. 3;

FIG. 3B is a detailed side view of an exemplary interconnection between a conductive trace of the flex circuit and a conductive pad on a circuit board taken along line 3B—3B of FIG. 3;

FIG. 7 is a side view of a dual flex circuit application in which one flex circuit is mounted on one side of the circuit board and the other is mounted on the opposite side.

DESCRIPTION OF THE PREFERRED EMBODIMENT

Figure 1:
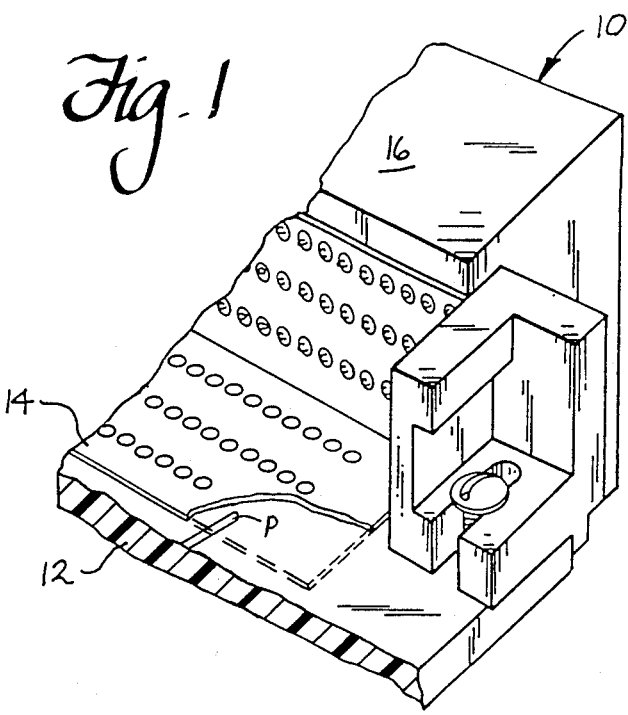
FIG. 1 is a partial, rear perspective view of a high pin count connector mounted to the edge of a printed circuit board with terminal pins of the connector connected to respective conductive pads on the printed circuit board by a flex circuit in accordance with the present invention.

An electrical connector, generally indicated by the reference character 10, is shown mounted to the edge of a printed circuit board 12 in FIGS. 1 and 2 with receptacles of the connector 10 interconnected with respective conductive pads P (represented in exemplary fashion in FIG. 1 by the reference character "P") on the circuit board 12 by flex circuits 14 and 14' having interconnects, described more fully below, which present substantially the same circuit impedance to each interconnect pair.

Figure 2:
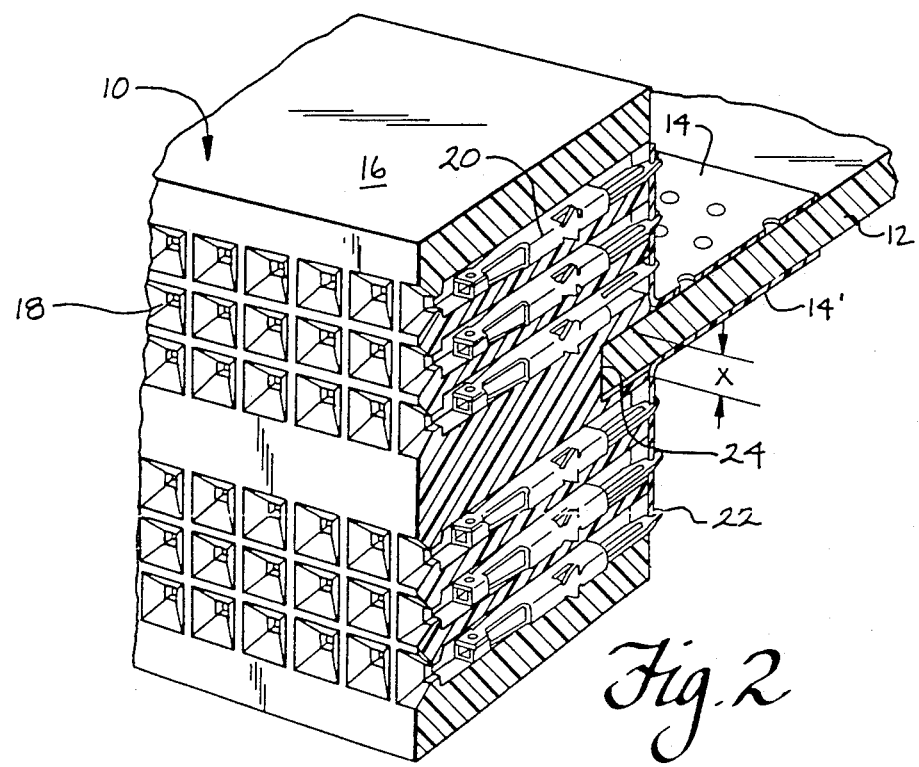
FIG. 2 is a partial, cutaway, perspective view of the high pin count connector of FIG. 1 from the side opposite that shown in FIG. 1.

The connector 10 includes a body portion 16 molded from a rigid plastic and includes, as shown in FIG. 2, an upper set of entryways 18 arranged in a three-row rectangular pattern and a lower set of similarly arranged entryways 18. In the illustrated embodiment, the entryways 18 are formed on 0.100 inch (2.54 mm) centers with each entryway 18 leading to an internal passage (unnumbered) in which a multi-beam receptacle, generally indicated at 20, is retained in place to define an upper set of receptacles 20 and another, lower set of receptacles 20. Each receptacle 20 includes a forwardly facing portion for accepting a pin from a mating plug (not shown) and a rearwardly extending tail portion 22 that extends rearwardly of the molded body 16 and defines a connection terminal as described below. In the preferred embodiment, the connector 10 is a high pin count connector marketed under the HPC-XXXX series designation by DuPont Electronics of New Cumberland, PA 17070. The upper set of receptacles 20 are connected by the flex circuit 14 to corresponding connection pads P on the upper side of the circuit board 12 and the lower set of receptacles 20 are connected by the flex circuit 14' to connection pads P on the lower side (not shown) of the circuit board 12.

The body 16 of the connector 10 is provided with a slot 24 (FIG. 2) on its rear side for accepting the edge of the circuit board 12. The slot 24 is provided with a width dimension 'X' that is sufficiently large to accommodate the expected range of circuit board thicknesses. For most applications and as shown in FIG. 2, the width dimension 'X' is larger than the thickness dimension of the circuit board 12 to provide a clearance space. As shown in FIG. 1, the connector 10 is attached to the circuit board 12 using a fastener (unnumbered) cooperating with an integrally molded bracket at the ends of the connector 10. While receptacles 20 have been defined as part of the illustrated embodiment, as can be appreciated, cylindrical or squared-sided pins (not shown) can likewise be provided with appropriate modification of the body 16.

As represented in the side view of the flex circuit 14 in FIG. 3, the flex circuits 14 and 14' each include first and second laminae 26 and 28 that constrain a pattern of electrically conductive traces (not shown in FIG. 3) between the two laminae to effect connection between the connector 10 and the connection pads P on the printed circuit board 12. The laminae 26 and 28 are preferably preshaped to conform to the particular application, and, for the application shown in FIGS. 1 and 2, the laminae 26 and 28 are shaped at a right angle to permit convenient installation, with the vertical portion shown in FIG. 3 connected at positions A, B, and C to the three rows of tail portions 22 and the horizontal portion connected at positions A', B', and C' to three rows of connection pads P on the circuit board 12 as described below. As shown in the enlarged detail of FIG. 3A, individual conductive traces, as represented in general form by the reference character 30, are connected to their respective tail portions 22 by providing apertures 32 through the lamina 28 and the conductive trace 30 and through which the tail portion 22 of the receptacle 20 extends. The lamina 26 includes an enlarged opening 34 that exposes the conductive area at the end of the trace 30 in the area immediately adjacent the tail portion 22. Electrical and mechanical connection is effected by soldering, represented at 36, in the usual manner. The connection to the printed circuit board 12 is a function of the type of interconnection desired. In the illustrated embodiment and as shown in FIG. 3B, the conductive traces 30 of the flex circuit 14 are connected to their connection pads P on the circuit board 12 by providing an aperture 32' in the lamina 26 and an enlarged opening 34' in the lamina 28 with the enlarged opening 34' facing its connection pad P. Soldering, as indicated by the reference character 38, is effected between the connection pad P and the conductive trace 30 to provide the electrical connection. Where the circuit board 12 is provided with terminal pins (not shown), the configuration of FIG. 3A can be used to effect connection with the circuit board 12.

Figures 4, 5:
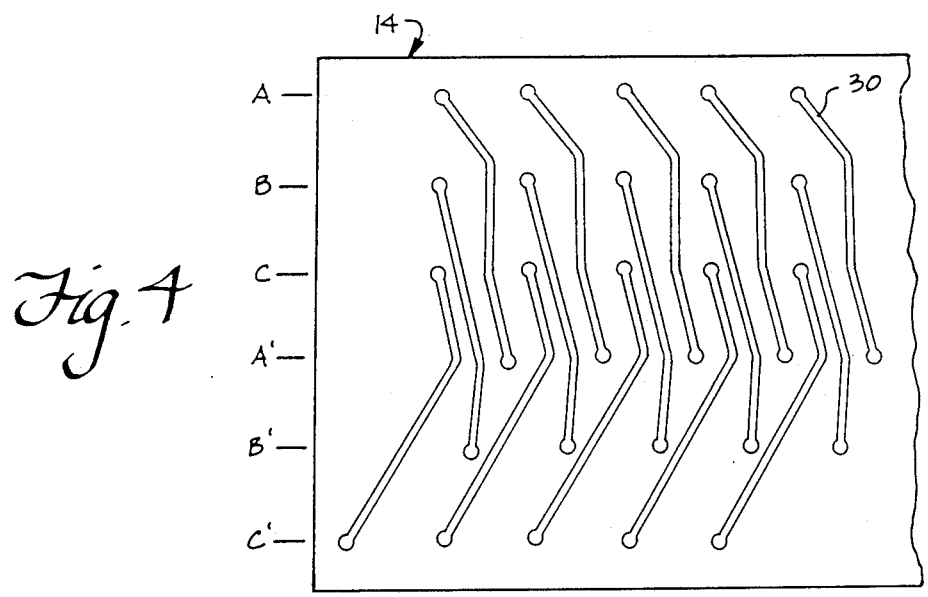
FIG. 4 is a partial flat development view of the flex circuit used in FIGS. 1-3 to effect an electrical interconnection between terminal pins on the connector and corresponding conductive pads on the printed circuit board and illustrating repeating sets of interdigitated conductive trace patterns.
FIG. 5 is a partial flat development view of the matrix pattern of the conductive end portions of the flex circuit of FIG. 4.
Figure 6:
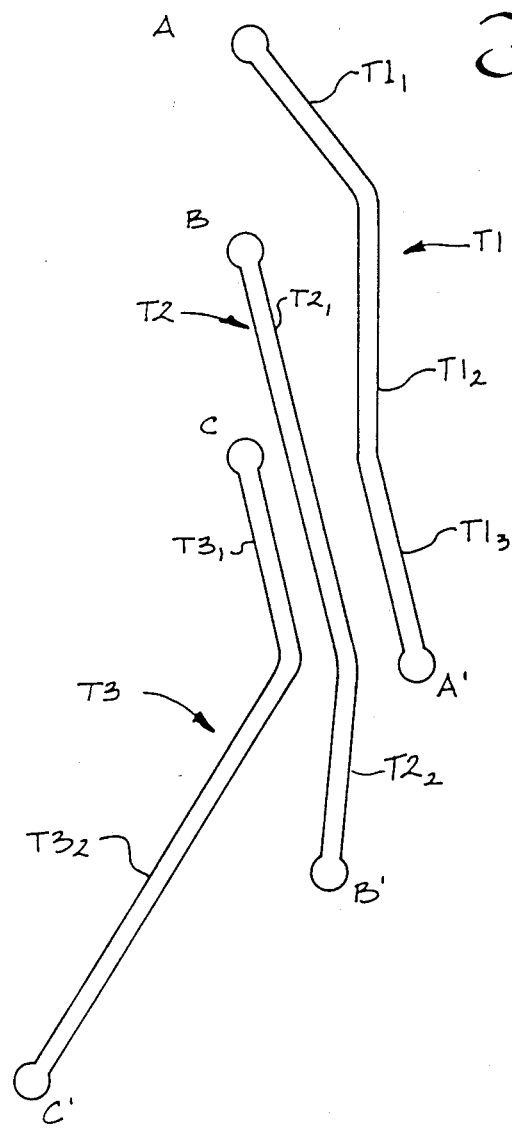
FIG. 6 is an enlarged view of a single set of conductive traces of the flex circuit of FIG. 4.

As shown in the partial, flat development view of the flex circuit 14 in FIG. 4, a recurring set of interdigitated conductive traces 30 are provided to effect connection from the connector 10 to the printed circuit board 12 with the opposite ends of the various traces 30 defining connection fields for connecting, respectively, the tail portions 22 extending from the connector 10 and the connection pads P on the circuit board 12. As also shown in the enlarged view of FIG. 6, representing a single set of conductive traces 30, the upper ends of the conductive traces 30 are arranged in the rows A, B, and C that correspond to the spacing of the tail portions 22 of the receptacles 20, as shown in FIG. 3, and, in an analogous manner, the lower ends of the conductive traces are likewise located in rows A', B', and C' to define a set of traces A-A', B-B', and C-C' that are repeated on a recurring basis as a function of the total number of interconnects that must be effected. In FIG. 6, the traces have been re-designated as trace T1 connecting ends A and A', trace T2 connecting ends B and B', and trace T3 connecting ends C and C'. As shown, each of the traces is defined by at least first and second trace sub-portions in which the sum of the path lengths for the various trace sub-portions is equal. More specifically, the trace T1 is defined by trace sub-portions $T1_1$, $T1_2$, and $T1_3$; the trace T2 is defined by trace sub-portions $T2_1$ and $T2_2$; and the trace T3 is defined by trace sub-portions $T3_1$ and $T3_2$. The sum of the various trace sub-portions for each of the traces T1, T2, and T3 are equal, that is, for the illustrated embodiment, the following relationship holds:

$$(T1_1)+(T1_2)+(T1_3)=(T2_1)+(T2_2)=(T3_1)+(T3_2)$$

By providing equal length traces T1, T2, and T3, the resistance presented to the various signals is substantially the same and, additionally, the impedance of any interconnect is substantially the same as that of any other interconnect to provide a connection system well suited for digital bus applications. In addition to providing equal length traces T1, T2, and T3, equal length portions of the traces T1, T2, and T3 are positioned adjacent one another to provide equal capacitive/inductive interactions. In the embodiment illustrated in FIG. 6, trace sub-portions $T1_3$, a part of sub-portion $T2_1$, and sub-portion $T3_1$ are positioned adjacent one another. Since the traces T1, T2, and T3 of FIG. 6 are positioned in a series of such traces, the trace sub-portions $T1_3$ and $T3_1$ will be bounded, respectively, by the immediately adjacent trace sub-portions $T3_1$ and $T1_3$ of other sets of traces T1, T2, and T3.

As shown in FIG. 5, the end points A, A', B, B', C, and C' of the traces T1, T2, and T3 are located at positions in a predefined matrix to allow the trace configuration described above. More specifically and as shown in FIG. 5, the end points A, A', B, B', C, and C' are positioned on a rectangular matrix having row position numbers 1 through 6, corresponding to the rows of the connection fields for the tail portions 22 of the connector 10 and the connection pads P of the circuit board, and column position numbers 1, 2, 3, 4, 5, 6, 7, 8, . . . corresponding to twice the total number of interconnect columns for the connector 10. As can be appreciated, the upper value of the column position number depends upon the length of the connector 10 and the total number of interconnect columns. Using the row position and column position indices, all the traces T1, T2, and T3 start at odd column position numbers with the trace T1 beginning at position (1,3) and ending at position (4,5), the trace T2 beginning at position (2,3) and ending at position (5,4), and the trace T3 beginning at position (3,3) and ending at position (6,1). The row positions for each of the beginning and ending points for all the traces varies by three row positions with the column number varying by a relative +2 or the trace T1, the column number varying by a relative +1 for the trace T2, and the column number varying by relative −2 for the trace T3.

The trace configuration described above is well suited for high speed digital bus applications since the interconnection path length is the same for each interconnect within the series and provides substantially same resistance and impedance characteristics. While a single flex circuit 14 can be provided to effect the various interconnects, the preferred embodiment is a shown in the side view of FIG. 7 in which flex circuits 14 and 14' effect interconnection between the connector 10 (shown in dotted line illustration) and the upper and lower sides of the print circuit board 12.

In the illustrated embodiment, the distance between the tail portions of the C row of the connector 10 and the A' row is equal to the row inter-spacing. As can be appreciated, the distance between the C row and the A' row can be increased for different applications while maintaining equal paths lengths for the various traces. While the preferred embodiment has been illustrated in the context of a connector that includes receptacles, the invention is equally well suited for use with headers that include pins for mating with the receptacles of a connector.

As can be appreciated by those skilled in the art, the present invention advantageously provides an impedance controlled interface for effecting an electrical connection between a connector and its circuit board in such a way that the resistance and related impedance characteristics are substantially the same for each circuit interconnect.

Thus it will be appreciated from the above that as a result of the present invention, an impedance controlled connector interface is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A connection interface for electrically connecting a multi-row connector or header having N rows of connection devices (where N≧2) to a circuit bearing substrate, comprising:

a flex circuit having a first field of N rows of connection areas for connection to a corresponding tail-portion field and having a second field of N rows of connection areas for connection to a corresponding connection field associated with a circuit bearing substrate, said flex circuit having N sets of electrically conductive traces extending between corresponding ones of the connection areas in each corresponding row of the first connection field and the second connection field, each of said traces presenting substantially the same impedance between its connection areas as the other of the traces.

2. The connection interface of claim 1, wherein each of said traces is of equal length between their respective connection areas.

3. The connection interface of claim 1, wherein each of said traces is of equal electrical resistance.

4. The connection interface of claim 1, wherein each of said traces of defined by at least first and second sub-portions.

5. A connection system for connecting a multi-row connector or header having at least two rows of connection devices to a circuit bearing substrate, comprising:

a first circuit defined by first and second layers of an insulating sheet material and having a first field of connection areas for connection to a corresponding tail-portion field and having a second field of connection areas for connection to a corresponding connection field associated with a circuit bearing substrate, the first and second connection area fields each defined by a respective first row of connection areas and a respective second row of connection areas, said flex circuit having a first set of electrically conductive traces extending between corresponding ones of the connection areas of the first row of the first and second connection fields and a second set of electrically conductive traces extending between corresponding ones of the connection areas of the second row of the first and second connection fields, each of said traces of said first and second sets of traces presenting substantially the same impedance to its connection areas as the other traces in its set and the traces of the other set.

6. The connection interface of claim 5, wherein each of said traces is of equal length between their respective connection areas.

7. The connection interface of claim 5, wherein each of said traces is of equal electrical resistance.

8. The connection interface of claim 5, wherein each of said traces of defined by at least first and second sub-portions.

9. The connection interface of claim 5, wherein the first and second rows of connection areas for the first connection area field and the second connection area field are separated by the same inter-row spacing.

10. A connection system for connecting a multi-row connector or header having at least three rows of connection devices to a circuit bearing substrate, comprising:

a flex circuit defined by first and second layers of an insulating sheet material and having a first field of connection areas for connection to a corresponding tail-portion field and having a second field of connection areas for connection to a corresponding connection field associated with a circuit bearing substrate, the first and second connection area fields of said flex circuit each defined by a respective first row of connection areas, a respective second row of connection areas, and a respective third row of connection areas, said flex circuit having a first set of electrically conductive traces extending between corresponding ones of the connection areas of the first rows of the first and second connection fields, a second set of electrically conductive traces extending between corresponding ones of the connection areas of the second rows of the first and second connection fields, and a third set of electrically conductive traces extending between corresponding ones of the connection areas of the third rows of the first and second connection fields, each of said traces of said first, second, and third sets presenting substantially the same impedance to its connection areas as the other traces in its set and the traces of the other sets.

11. The connection interface of claim 10, wherein each of said traces is of equal length between their respective connection areas.

12. The connection interface of claim 10, wherein each of said traces is of equal electrical resistance.

13. The connection interface of claim 10, wherein each of said traces of defined by at least first and second sub-portions.

14. The connection interface of claim 10, wherein the first, second, and third rows of connection areas for the first connection area field and the second connection area field are separated by the same inter-row spacing.

15. A connection system for connecting a multi-row connector or header having at least six rows of connection devices to opposite sides of a circuit bearing substrate, comprising:

a six row connector or header attached to an edge of a circuit bearing substrate and having the first three rows of connection devices associated with one side of the circuit bearing substrate and the second three rows of connection devices associated with the other side of the circuit bearing substrate, said circuit bearing substrate having a first connection field on the one side for connection with the first three rows and a second connection field on the opposite side for connection to the second three rows;

first and second flex circuits for connecting, respectively, the first three rows to the first connection field of the circuit bearing substrate and the second three rows to the second connection field of the circuit bearing substrate, each flex circuit defined by first and second layers of an insulating sheet material and having a first field of connection areas for connection to a corresponding tail-portion field and having a second field of connection areas for connection to the second connection field associated with the circuit bearing substrate, the first and second connection area fields each defined by a respective first row of connection areas, a respective second row of connection areas, and a respective third row of connection areas, said flex circuit having a first set of electrically conductive traces extending between corresponding ones of the connection areas of the first rows of the first and the second connection field, a second set of electrically conductive traces extending between corresponding ones of the connection areas of the second rows of the first and the second connection fields, and a third set of electrically conductive traces extending between corresponding ones of the connection areas of the connection areas of the third rows of the first and the second connection field, each of said traces of said first, second, and third set presenting substantially the same impedance to its connection areas as the other of the traces in its set and the traces of the other sets.

16. The connection interface of claim 15, wherein each of said traces is of equal length between their respective connection areas.

17. The connection interface of claim 15, wherein each of said traces is of equal electrical resistance.

18. The connection interface of claim 15, wherein each of said traces of defined by at least first and second sub-portions.

19. The connection interface of claim 15, wherein the first, second, and third rows of connection areas for the first connection area field and the second connection area field are separated by the same inter-row spacing.

* * * * *